(12) United States Patent
Krause et al.

(10) Patent No.: US 8,507,828 B2
(45) Date of Patent: Aug. 13, 2013

(54) METHOD FOR PRODUCING A CONTACT STRUCTURE OF A SEMICONDUCTOR COMPONENT

(75) Inventors: Andreas Krause, Dresden (DE); Bernd Bitnar, Freiberg (DE); Holger Neuhaus, Freiberg (DE); Frederick Bamberg, Freiberg (DE)

(73) Assignee: Deutsche Cell GmbH, Freiberg/Sachsen (DE)

(*) Notice: Subject to any disclaimer, the term of this patent is extended or adjusted under 35 U.S.C. 154(b) by 1079 days.

(21) Appl. No.: 12/495,220

(22) Filed: Jun. 30, 2009

(65) Prior Publication Data
US 2010/0001407 A1    Jan. 7, 2010

(30) Foreign Application Priority Data
Jul. 1, 2008   (DE) .................... 10 2008 030 725

(51) Int. Cl.
- B23K 26/38    (2006.01)
- H01L 21/283   (2006.01)
- H01L 31/0224  (2006.01)
- H01L 31/18    (2006.01)

(52) U.S. Cl.
USPC ................ 219/121.69; 427/555; 438/100

(58) Field of Classification Search
USPC .............. 427/554, 555; 219/121.69, 121.85
See application file for complete search history.

(56) References Cited

U.S. PATENT DOCUMENTS

| | | | |
|---|---|---|---|
| 5,057,184 A | 10/1991 | Grupta et al. | |
| 6,495,200 B1 * | 12/2002 | Chan et al. | 438/626 |
| 2006/0201997 A1 * | 9/2006 | Tung | 228/101 |
| 2007/0040272 A1 * | 2/2007 | Sheats | 257/737 |
| 2007/0268422 A1 * | 11/2007 | Song et al. | 349/43 |
| 2007/0281247 A1 * | 12/2007 | Phillips et al. | 430/311 |
| 2009/0239331 A1 * | 9/2009 | Xu et al. | 427/596 |
| 2010/0213166 A1 * | 8/2010 | Kray et al. | 427/596 |
| 2011/0210428 A1 * | 9/2011 | Bitnar et al. | 257/632 |

FOREIGN PATENT DOCUMENTS

| | | |
|---|---|---|
| DE | 199 15 666 A1 | 10/2000 |
| DE | WO 00/60674 | 10/2000 |
| DE | 102006041424 | 3/2008 |
| DE | WO 2008/107194 | 9/2008 |
| DE | 102007038744 A1 | 2/2009 |

* cited by examiner

*Primary Examiner* — Geoffrey S Evans
(74) *Attorney, Agent, or Firm* — McGlew and Tuttle, P.C.

(57) ABSTRACT

A method for the production of a contact structure of a semiconductor component comprises the masking of at least one side of a semiconductor substrate with a coating and the partial removal thereof in at least one pre-determined region.

20 Claims, 2 Drawing Sheets

METHOD FOR PRODUCING A CONTACT STRUCTURE OF A SEMICONDUCTOR COMPONENT

BACKGROUND OF THE INVENTION

1. Field of the Invention

The invention relates to a method for the production of a contact structure of a semiconductor component. The invention further relates to an intermediate product in the production of a semiconductor component.

2. Background Art

Semiconductor components, in particular solar cells, comprise contact structures. These contact structures have a significant influence on the quality, in particular the efficiency, of the solar cells. A conventional method for applying the contact structures comprises the application of a mask by means of a spin-on or a spray-on method, the mask then being structured by means of a photolithographic process. These methods are very laborious and expensive, making it difficult for them to be implemented economically in the mass production of solar cells.

SUMMARY OF THE INVENTION

Therefore, it is the object of the invention to simplify a production method for contact structures of semiconductor components. Furthermore, it is the object of the invention to provide a semiconductor component comprising an economically producible contact structure.

This object is achieved by a method for the production of a contact structure of a semiconductor component, the method comprising the steps of providing a two-dimensional semiconductor component comprising a first side and a second side which is opposite to said first side, and masking at least one of the sides by coating at least one of the sides with a coating and partially removing the coating in at least one predetermined region.

This object is further achieved by an intermediate product in the production of a semiconductor component, the intermediate product comprising a two-dimensional semiconductor substrate comprising a first side and a second side which is opposite to said first side, and a mask which is applied to the semiconductor substrate and comprises openings which pass through the entire mask and are laterally bounded by steep flanks.

The gist of the invention is to provide a semiconductor substrate with a masking. The mask is advantageously produced by immersing the semi-conductor substrate into a resist solution which is then structured by means of laser ablation. A method of this type is simple and economical. Furthermore, a high accuracy is achieved.

Features and details of the invention will become apparent from the description of an embodiment by means of the drawing.

The Figures are only diagrammatic illustrations, in other words they are not to scale.

DESCRIPTION OF THE PREFERRED EMBODIMENTS

Figure 1:
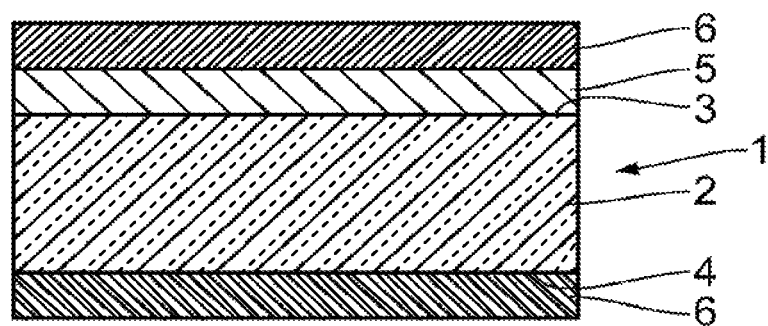
FIG. 1 shows a semiconductor substrate after application of a dielectric layer and a resist layer.
Figure 2:
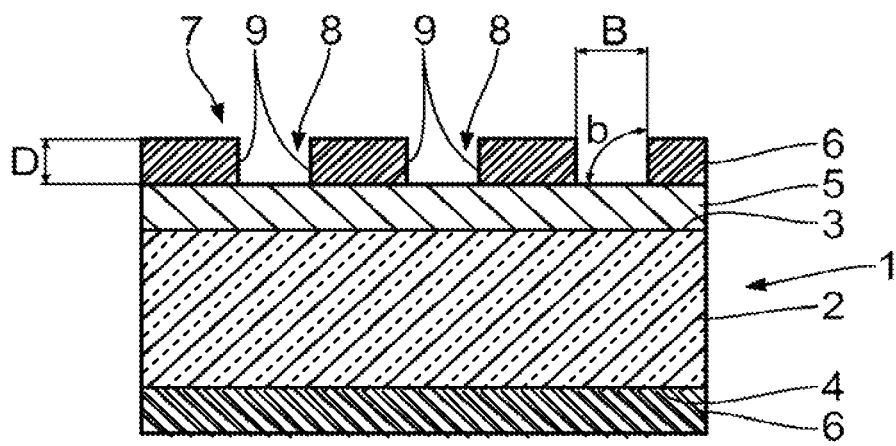
FIG. 2 shows the semiconductor substrate according to FIG. 1 after partially removing the resist layer.
Figure 3:
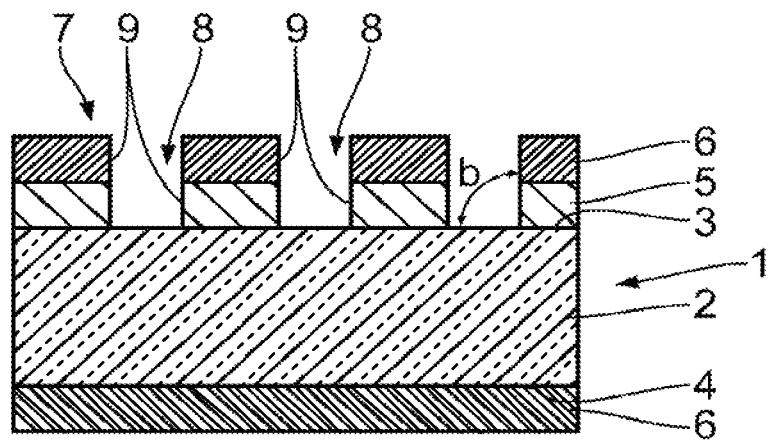
FIG. 3 shows the semiconductor substrate according to FIG. 2 after opening of the dielectric layer.
Figure 4:
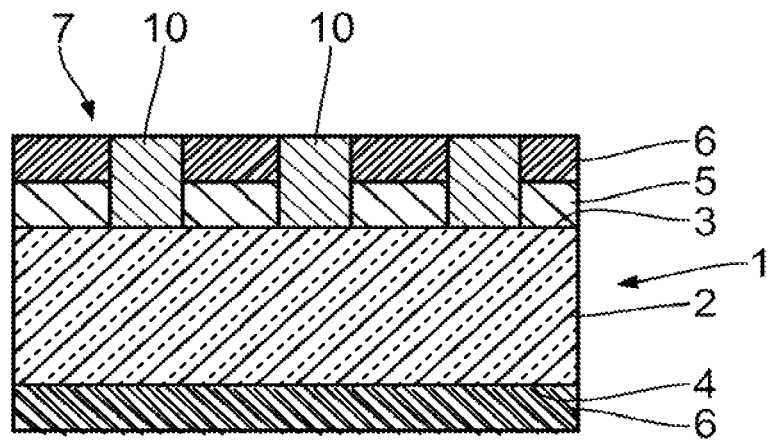
FIG. 4 shows the semiconductor substrate according to FIG. 3 after a metallization.

The following is a description of a first embodiment of the invention with reference to FIGS. 1 to 4. A semiconductor component 1 initially comprises a flat, in other words two-dimensional, semiconductor substrate 2 with a front side 3 and a back side 4 which is arranged opposite thereto. The semiconductor component 1 is in particular a solar cell. The semiconductor component 2 consists of a semiconductor material, in particular of silicon. Other semiconductor materials are however conceivable as well. In a first step, a passivation layer 5 is applied to the front side 3 of the semiconductor substrate 2, the passivation layer 5 also serving as an antireflection layer. The passivation layer 5 consists of a dielectric material, in other words it is electrically insulating. The passivation layer 5 advantageously consists of silicon nitride or silicon dioxide. It has a thickness of preferably less than 200 nm, in particular less than 100 nm.

The semiconductor substrate 2 is then provided with a coating 6. The coating 6 is provided both on the front side 3 and on the back side 4. It covers in particular the entire passivation layer 5. It is of course conceivable as well for the coating 6 to be applied to only one of the sides 3, 4. The coating is in particular a resist layer. It is applied by immersing the semiconductor substrate 2 into a resist solution. The process is thus referred to as dip coating. As a result, a thin resist layer is applied to both sides 3, 4 of the semiconductor substrate 2 when the semiconductor substrate 2 is immersed into the resist. The resist is resistant to subsequent etching and/or electrolyte baths.

The resist typically comprises an epoxy resin which is dissolved in organic solvents. After coating, the resist is allowed to dry at a temperature between 25° C. and 120° C., in particular at 100° C. At 150-160° C., an optional cross-linking step can be performed for curing the resist. The resist layer has a thickness in the range of 1-50 µm, in particular 5 to 15 µm.

A mask 7 is then produced by removing the coating 6 in predetermined regions. This is performed by means of a laser process, in particular a laser ablation. A method of this type allows openings 8 to be produced in the coating 6 with high accuracy. The openings 8 have a width B in the range of 1 µm to 100 µm, in particular in the range of up to 20 µm, in particular in the range of up to 10 µm. The openings 8 are in the shape of a channel. The accuracy of the arrangement and the dimensions of the openings 8 which is achievable by means of the laser process according to the invention is better than 5 µm, in particular better than 2 µm, in particular better than 1 µm. The openings 8 are laterally bounded by steep flanks 9. The flanks 9 form an angle b of 70° -100°, in particular 80° -90° with the side 3 of the semiconductor substrate 2 disposed therebelow.

Advantageously, a liquid-jet guided laser is provided for laser ablation. The liquid jet may contain dopants such as phosphorous, boron, arsenic, antimony or compounds thereof. In a particular advantageous embodiment, the passivation layer 5 is opened as well when the coating 6 is partially removed by means of the laser process. This allows the semiconductor susbtrate 2 to be doped in the opened regions with the dopants contained in the liquid jet. Furthermore, the laser ablation process also allows a thin surface layer of the semiconductor substrate 2 to be removed.

Alternatively, the passivation layer 5 may also be opened in the region of the openings 8, which are not covered by the mask 7, by means of a wet chemical etching process instead of the laser process.

After opening the passivation layer 5, the front side 3 of the semiconductor substrate 2 is exposed. At least one metal layer 10 is then deposited into the openings 8 so as to form a contact structure. The contact structure is advantageously comprised of several layers. Deposition of the metal layer 10 can be performed by means of a chemical and/or a galvanic process. The mask 7, in particular the lateral flanks 9 thereof, prevents the contact structure from widening. The mask 7 has a thickness D in the range of 1 µm to 50 µm, in particular of 5 to 15 µm.

A detailed description of the contact structure and the deposition thereof in the openings 8 can be found in DE 10 2007 038 744. The contact structure advantageously comprises a barrier layer, a conductive layer arranged on said barrier layer and a cover layer arranged on said conductive layer. The barrier layer consists of a material, in particular a metal, which has a negligible diffusion coefficient and a negligible miscibility with respect to the material of the semiconductor substrate 2 and the conductive layer. The barrier layer in particular consists of electrolytically or chemically deposited nickel or cobalt. The barrier layer has high electrical conductivity. The barrier layer may in particular consist of copper. It may also comprise at least a proportion of silver. The cover layer advantageously consists of tin and/or silver and/or nickel. The cover layer is anti-corrosive.

In a final step, the mask 7 is stripped, in other words removed.

Applying the mask 7 and the metal layer 10 is of course not limited to the front side 3 of the semiconductor substrate 2. It may also be applied to the back side 4 of the semiconductor substrate 2 or to both sides thereof.

What is claimed is:

1. A method for the production of a contact structure of a solar cell, the method comprising the following steps:
    providing a solar cell comprising a first side and a second side which is opposite to said first side;
    applying a passivation layer to said first side;
    masking at said first side with a mask by coating the first side with a coating, wherein said coating comprises a resist layer having a thickness in a range of 1 µm to 50 µm, said resist layer comprising an epoxy resin, said coating covering the entire passivation layer;
    partially removing the coating in at least one predetermined region, wherein a deposition of at least one metal layer is provided after masking to form a contact structure, wherein said mask prevents said contact structure from widening.

2. A method according to claim 1, wherein the coating is applied to both sides.

3. A method according to claim 1, wherein said thickness of said resist layer is in a range of 5 µm to 15 µm.

4. A method according to claim 1, wherein a dip coating process is provided for applying the coating.

5. A method according to claim 1, wherein prior to coating, the semiconductor substrate is provided with a dielectric antireflection layer on at least one side.

6. A method according to claim 5, wherein the antireflection layer is opened by means of an etching process after partially removing the coating.

7. A method according to claim 5, wherein when the coating is partially removed, the antireflection layer is opened as well.

8. A method according to claim 1, wherein a laser process is provided for partially removing the coating.

9. A method according to claim 8, wherein a laser ablation is provided for partially removing the coating.

10. A method according to claim 9, wherein the laser ablation is performed by means of a liquid jet guided laser.

11. A method according to claim 10, wherein the liquid jet contains a dopant for doping the semiconductor substrate.

12. A method for the production of a contact structure of a solar cell, the method comprising the following steps:
    providing a solar cell comprising a first side and a second side, said second side being opposite said first side;
    masking at least one of said first side and said second side with a mask by coating said at least one of said first side and said second side with a coating, said coating comprising a passivation layer;
    partially removing said coating in at least one predetermined region via laser ablation, wherein a deposition of at least one metal layer is provided after masking to form a contact structure, wherein said laser ablation is performed via a liquid jet guided laser, wherein said liquid jet guided laser contains a dopant for doping a semiconductor substrate of said solar cell.

13. A method according to claim 12, wherein said coating comprises a resist layer covering the entire passivation layer, said resist layer comprising an epoxy resin, said resist layer having a thickness in a range of 1 µm to 50 µm.

14. A method for the production of a contact structure of a solar cell, the method comprising the following steps:
    providing a solar cell comprising a solar cell substrate having a first side and a second side, said first side being opposite said second side;
    applying a passivation layer to said first side, said passivation layer having an outer passivation layer surface;
    providing a coating;
    applying said coating to said passivation layer such that said outer passivation layer outer surface is completely covered by said coating to form a mask on said first side;
    partially removing said mask and said passivation layer in at least one predetermined region, said coating comprising a coating portion, said passivation layer comprising a passiviation layer portion, at least said passivation layer portion and said coating portion defining an opening;
    depositing at least one metal layer in said opening to form a contact structure, said contact structure having a top outer contact structure surface, said at least one metal layer being in direct contact with said passivation layer portion, said coating portion and said solar cell on said first side, wherein said coating portion defines a width of said top outer contact structure surface.

15. A method according to claim 14, wherein at least said mask prevents said contact structure from widening, said coating comprising a resist layer having a thickness in a range of 1 µm to 50 µm, said resist layer comprising an epoxy resin.

16. A method according to claim 14, wherein said coating comprises another coating portion, said passivation layer comprising another passivation layer portion, said coating portion, said another coating portion, said passivation layer portion and said another passivation layer portion defining said opening, said coating portion and said another coating portion defining said width of said top outer contact structure surface.

17. A method according to claim 16, wherein said coating portion comprises a coating portion side surface, said another coating portion comprises another coating portion side surface, said passivation layer portion comprising a passivation layer portion side surface, said another passivation layer portion comprising another passivation layer portion side surface, said coating side surface being aligned with said passivation layer portion side surface, said another coating portion side surface being aligned with said another passivation layer portion side surface.

18. A method according to claim 17, wherein at least said coating portion, said another coating portion, said passivation layer and said another passivation layer define a height of said contact structure.

19. A method according to claim 18, wherein said solar cell comprises a first side surface extending between said passivation layer portion and said another passivation layer portion, said contact structure engaging said first side surface, said coating side surface, said passivation layer portion side surface, said another coating portion side surface and said another passivation layer portion side surface.

20. A method according to claim 18, wherein said coating portion comprises a coating portion outer surface, said another coating portion comprising another coating portion outer surface, said outer contact structure surface being aligned with said coating portion outer surface and said another coating portion outer surface, said contact structure comprising a solar cell substrate contact surface, said passivation layer portion and said another passivation layer portion defining a width of said solar cell substrate contact surface.

\* \* \* \* \*